(12) United States Patent
Cayrefourcq et al.

(10) Patent No.: US 6,693,926 B2
(45) Date of Patent: Feb. 17, 2004

(54) MEMS-BASED SELECTABLE LASER SOURCE

(75) Inventors: Ian Cayrefourcq, Paris (FR); Pascal P. Maigne, Samois/Seine (FR)

(73) Assignee: Corning Incorporated, Corning, NY (US)

(*) Notice: Subject to any disclaimer, the term of this patent is extended or adjusted under 35 U.S.C. 154(b) by 261 days.

(21) Appl. No.: 09/778,683

(22) Filed: Feb. 7, 2001

(65) Prior Publication Data

US 2001/0050928 A1 Dec. 13, 2001

(51) Int. Cl.⁷ .................. H01S 3/121; H01S 3/10; G02B 6/26
(52) U.S. Cl. ............. 372/14; 372/15; 372/23; 372/99; 385/17; 385/18
(58) Field of Search .............. 372/23, 99, 14–15, 372/50; 385/16–18

(56) References Cited

U.S. PATENT DOCUMENTS

| | | | |
|---|---|---|---|
| 5,420,416 A | | 5/1995 | Iida et al. ............ 250/201.1 |
| 5,612,968 A | * | 3/1997 | Zah ........................ 372/50 |
| 5,870,518 A | | 2/1999 | Haake et al. ............ 385/90 |
| 5,903,687 A | | 5/1999 | Young et al. ........... 385/17 |
| 5,923,462 A | * | 7/1999 | van der Plaats ........ 359/341 |
| 5,937,117 A | | 8/1999 | Ishida et al. ............ 385/24 |
| 6,385,364 B1 | * | 5/2002 | Abushagur .............. 385/16 |
| 6,396,976 B1 | * | 5/2002 | Little et al. ............ 385/18 |
| 6,404,942 B1 | * | 6/2002 | Edwards et al. ........ 385/18 |

FOREIGN PATENT DOCUMENTS

EP 0 279 932 B1 12/1987

OTHER PUBLICATIONS

Markus. et al, Notable advances in fiber alignment through MEMS. Lightwave Oct. 1999 pp. 91–92.

* cited by examiner

*Primary Examiner*—Paul Ip
*Assistant Examiner*—James Menefee
(74) *Attorney, Agent, or Firm*—Julinna Agon

(57) ABSTRACT

A MEMS-based selectable laser output optical device (10) includes a laser source (12) having a laser output 14. A MEMS switch (16) is optically coupled to the laser source (12) for selectively coupling the laser output (14) from the laser source (12) in one of two directions (141) or (142). The MEMS switch (16) has a mirror (160) that is slidable or otherwise movable from a first position (161), where the mirror (160) is laying flat or in another non-obstructing position to provide a non-obstructing linear exit optical path (141). A second position (162) where the mirror (160) is in its upright vertically aligned direction, obstructs the linear optical path to re-direct the optical path in a non-linear direction.

14 Claims, 10 Drawing Sheets

MEMS-BASED SELECTABLE LASER SOURCE

CROSS REFERENCE TO RELATED APPLICATION

This application claims the benefit of French Application No. 0001649, filed Feb. 10, 2000.

BACKGROUND OF THE INVENTION

1. Field of the Invention

The present invention relates generally to microactuators, and particularly to the hybridization of a microactuator component, such as a micro-electro-mechanical-system (MEMS) to a discrete optical communication component, such as a laser array.

2. Technical Background

In an optical communications network (both for Long Haul and metro applications), most of the system breakdowns are caused by laser source failures. Currently, the only way to repair the system is to replace the failed source, which can not be done instantaneously. Spares or redundant sources are therefore necessary if a quick change is necessary. The number of lasers used in wavelength division multiplexed (WDM) systems continues to increase for network configurations. Thus, doubling the number of laser sources to provide backups in case of system breakdown is becoming more and more costly.

One possible solution would be to use a wavelength tunable laser as a spare source. Then when the primary laser source fails, at whatever the wavelength, the tunable source takes over until the failed source can be replaced. The main problem with this approach is that the wavelength stability of such commercially available tunable sources may not be stable enough. The currently available tunable sources also require a separate device for monitoring and locking on a given wavelength. The electronics for this monitoring and locking are complex, expensive and very bulky at this time. No single component currently available on the market satisfies this and other requirements (i.e. performance, cost, size, coupling and thermal loss) for such a desired WDM backup laser source.

Therefore alternatives are under consideration. Among them, one consists in covering, for instance, the forty channel of a given network, with five modules of eight lasers integrated in a single array. This presents an economical solution in terms of space, electronics and cost.

This approach consists in mounting a laser array, an 8×1 combiner, a semiconductor optical amplifier (SOA) and a photodiode on a common platform using flip-chip technology. However, the losses and large size associated with a conventional combiner maybe prohibitive in a small package.

Therefore, a need exist to provide a back-up laser source with available discrete elements while satisfying performance, cost, size, coupling and thermal loss design requirements.

SUMMARY OF THE INVENTION

One aspect of the present invention is the teaching of a MEMS-based selectable laser output optical device including a laser source having a laser output and a MEMS switch optically coupled to the laser source for selectively coupling the laser output from the laser source in a selectable direction.

In another aspect, the present invention includes a substrate having a first optical input waveguide, a second optical input waveguide, and an optical output waveguide wherein a first laser source is disposed on the substrate coupled to the first optical input waveguide and a second laser source is disposed on the substrate coupled to the second optical input waveguide. A MEMS switch having a mirror movable in response to a control signal then optically directs an optical signal from one of the first optical input waveguide in a first mirror position or the second optical input waveguide in a second mirror position to the optical output waveguide as the laser source output.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE PREFERRED EMBODIMENTS

Reference will now be made in detail to the present preferred embodiments of the invention, examples of which are illustrated in the accompanying simplified drawings. Wherever possible, the same reference numbers will be used throughout the drawings to refer to the same or like parts. An exemplary embodiment of the MEMS-based selectable laser output optical device of the present invention is shown in FIG. 1, and is designated generally throughout by reference numeral 10.

Instead of using an 8×1 lossy combiner as one approach of providing a multi-wavelength laser source, the use of an 8×1 MEMS based-cross-connect switch is taught by the present invention to select a desired laser from a plurality of laser sources available. As is known in the art, a microelectromechanical system (MEMS) includes a row of moving mirrors activated ether by thermal or electrostatic energy. These MEMS mirrors are characterized by a latching behavior that allows power savings.

Figure 1:
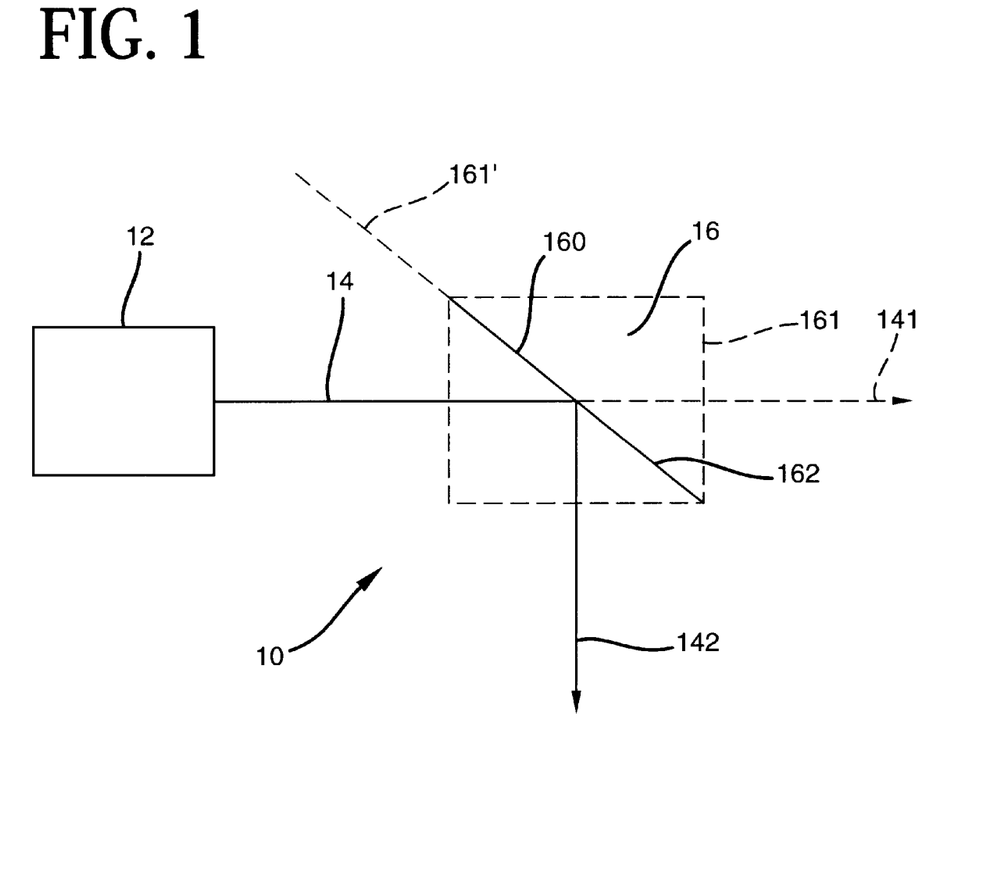
FIG. 1 is a basic schematic representation of a MEMS-based selectable laser output optical device, in accordance with the present invention.

In accordance with the invention, the present invention for a MEMS-based selectable laser output optical device 10 includes a first element of a laser source 12 having a laser output 14 as generically represented in FIG. 1. A second element of a MEMS switch 16 is optically coupled to the laser source 12 for selectively coupling the laser output 14 from the laser source 12 in one of two directions 141 or 142. The MEMS switch 16 has a mirror 160 that is slidable or otherwise movable from a first position 161, where the mirror 160 is represented in dashed-lines to show that it is laying flat or in another non-obstructing position, such as being slid out-of-the-way still in an upright position 161', to provide a non-obstructing linear exit optical path 141. A second position 162 is shown as a solid line, representing the mirror 160 in its upright vertically aligned direction, preferably at a forty-five degree angle or in another obstructing position, such that the mirror 160 obstructs the linear optical path to re-direct the optical path in a perpendicular direction or another non-linear direction.

Figure 2:
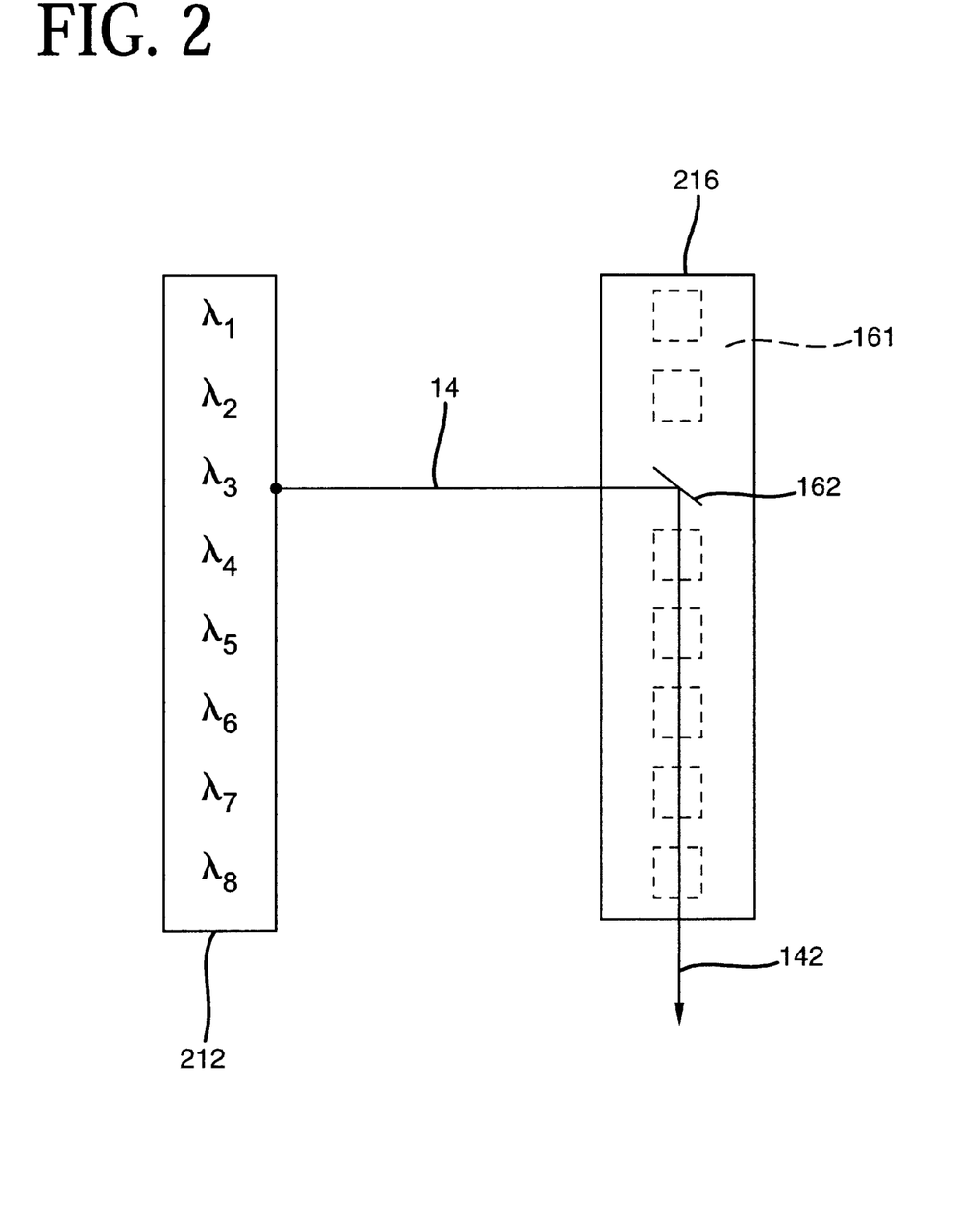
FIG. 2 is an arrayed schematic representation of a first embodiment of the laser 12 and MEMS switch 16 of FIG. 1, in accordance with the present invention.

As embodied herein, and depicted in FIG. 2, the laser source 12 of FIG. 1, is a laser array 212 that can either be a multi-wavelength laser array having a plurality of lasers each having a different wavelength (selectable wavelength source) or a mono-wavelength laser array having a plurality of lasers each having the same wavelength (permanent laser cartridge) to form a spare source that is either wavelength selective or a redundant permanent laser source to last many times (nx) longer than having just one laser present, respectively. Accordingly, the MEMS switch 16 of FIG. 1 is an n×1 MEMS cross-connect switch 216 to cross-connect couple with the n-lasers 212 whether at the same wavelength or at different wavelengths.

Figure 3:
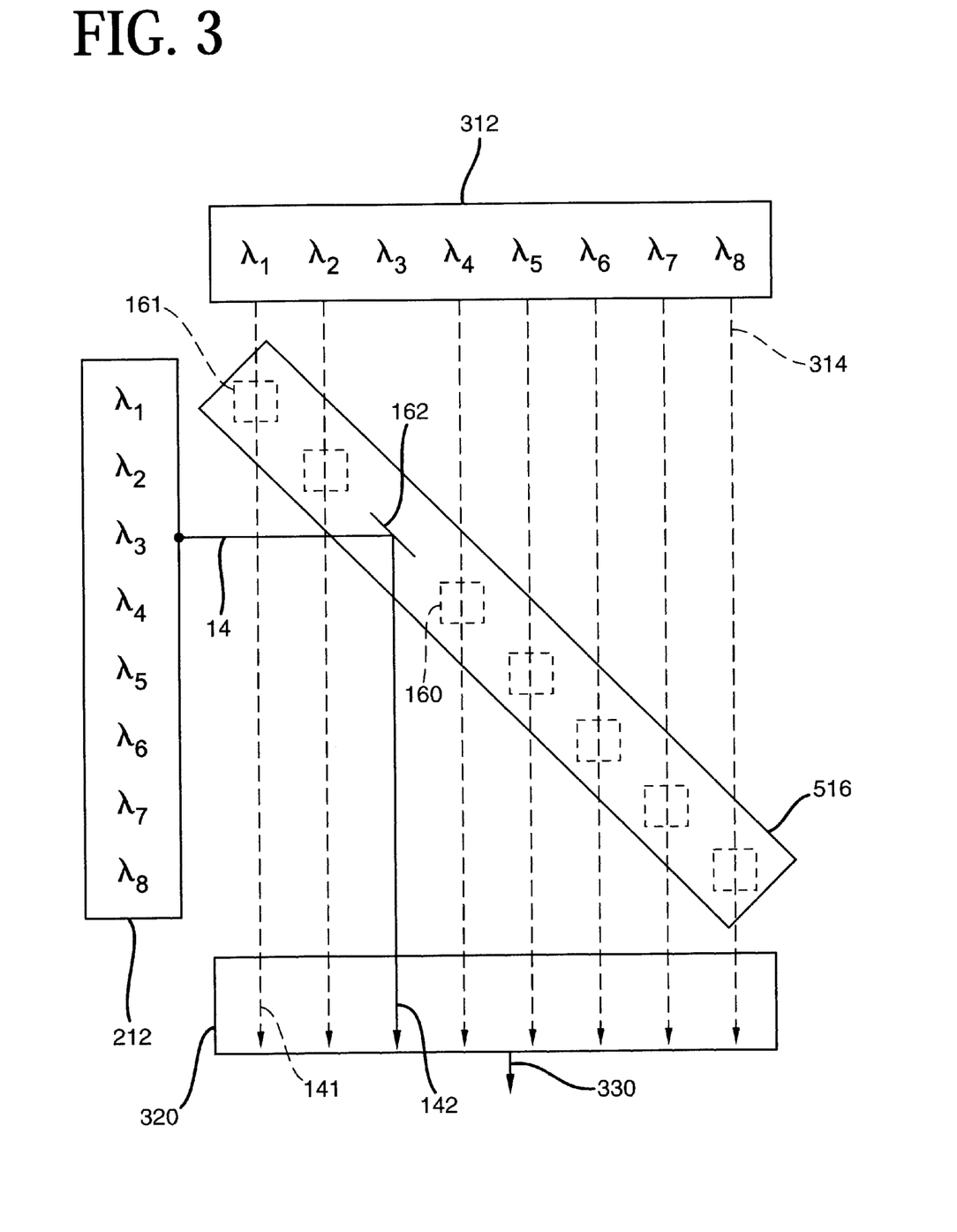
FIG. 3 is an arrayed schematic representation of a second embodiment of the laser 12 and MEMS switch 16 of FIG. 1, in accordance with the present invention.

Referring to FIG. 3, a simple schematic representation of how the spare source 212 of FIG. 2, in its wavelength selectable version, according to the present invention or a tunable version as currently available, can be used with a normally functioning laser source or array 312 for multiplexing the array of outputs in a multiplexer 320 to form a multiplexed output 330 for use by a network. Here, the MEMS-based selectable laser source 12 of FIG. 1 includes the normally functioning laser array as a first laser source 312 and the spare source 212 of FIG. 2 as a second laser source 212 for substituting in a selected wavelength for any wavelength that is no longer functioning. A MEMS switch 516 has the selected mirror 160 that is movable in response to a control signal that is also activating the corresponding wavelength of the spare laser source 212 to substitute in for the non-functioning laser having this same wavelength in the first laser array 312. The MEMS switch will thus optically direct the normally functioning optical signal from the normally functioning array 312 in the first mirror position 161 or substitute in the signal from the spare source 212 in the second mirror position 162 to the multiplexer 320 as the multiplexed laser source output 330.

Figure 4:
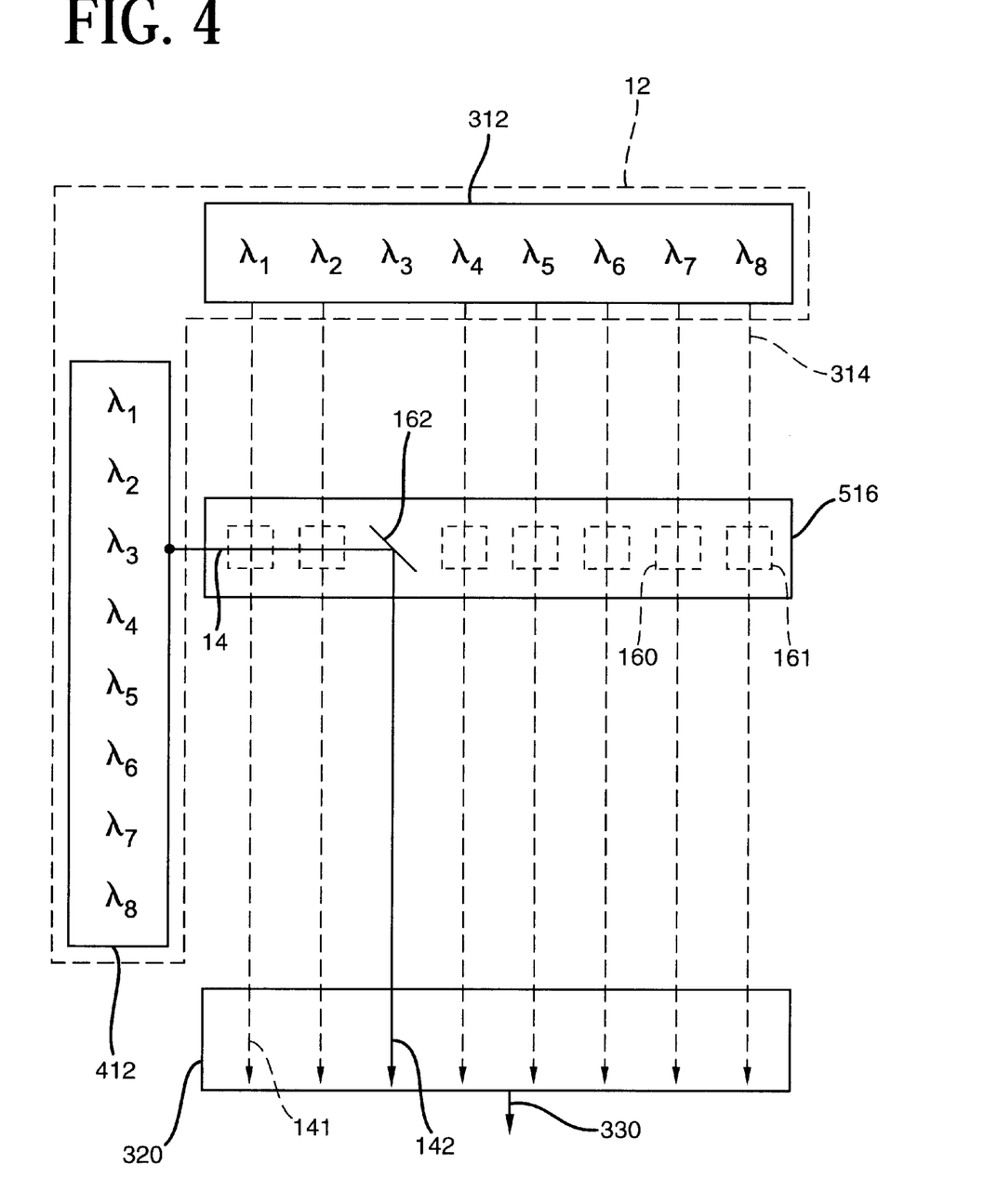
FIG. 4 is an arrayed schematic representation of a third embodiment of the laser 12 and MEMS switch 16 of FIG. 1, in accordance with the present invention.

Referring to FIG. 4, if a currently available tunable wavelength source is used as the spare 212 in FIG. 3, then FIG. 3 can be more simply shown as the tunable source 412 perpendicularly coupled to a 1×n MEMS cross-connect switch 516.

Figure 5:
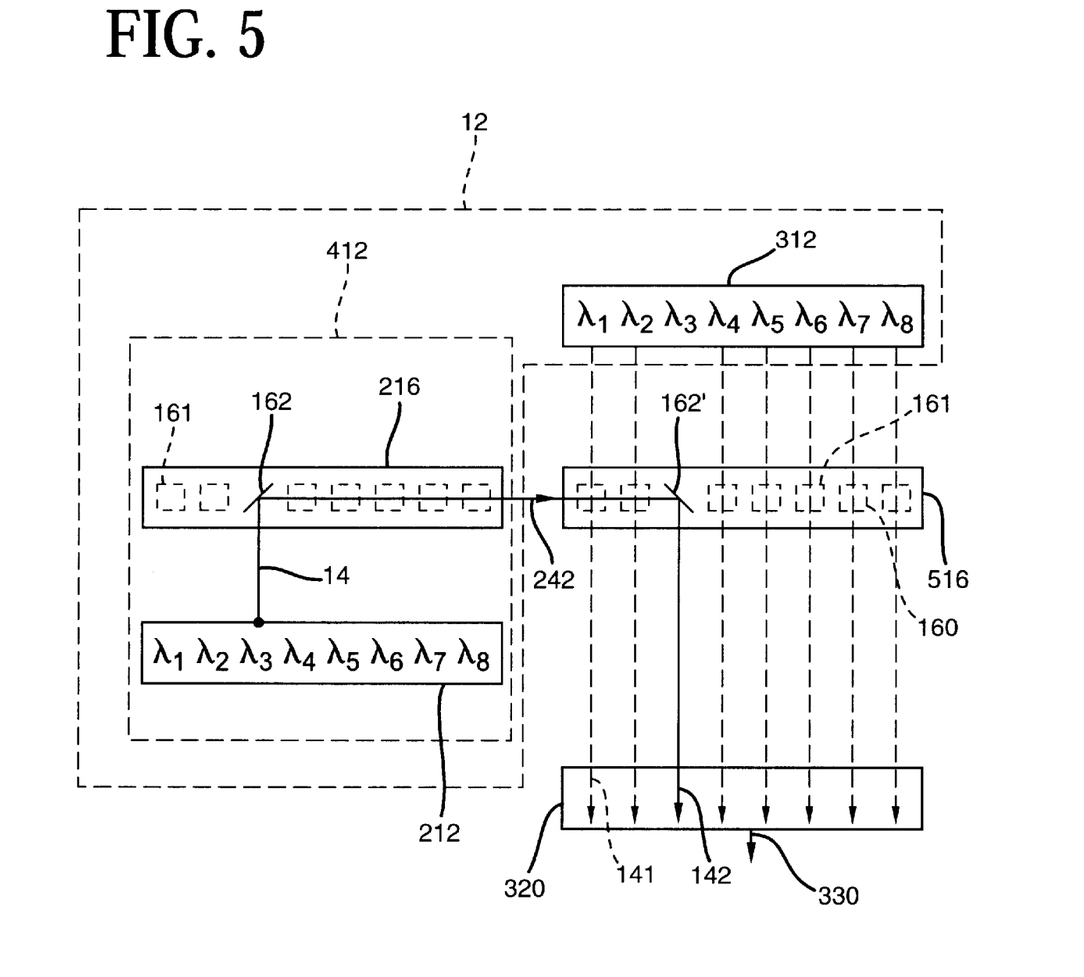
FIG. 5 is a an arrayed schematic representation of the third embodiment of the laser 12 and MEMS switch 16 of FIG. 1, using the selectable wavelength source 212 of FIG. 2 as the spare source 412 of FIG. 4, in accordance with the present invention.

If the diagonal coupling of the MEMS switch 516 between the perpendicular matrixed arrangement of the first and second sources 312 and 212 in FIG. 3 is not practical, then the wavelength selectable spare source of FIG. 2 can be substituted in for the spare source 412 in FIG. 4 and as shown in FIG. 5 where the first MEMS switch 216 that is n×1 and having a selected mirror activated 162 is now linearly coupled with a second MEMS switch 516 that is n×1 having a corresponding mirror activated 162'.

Figure 6:
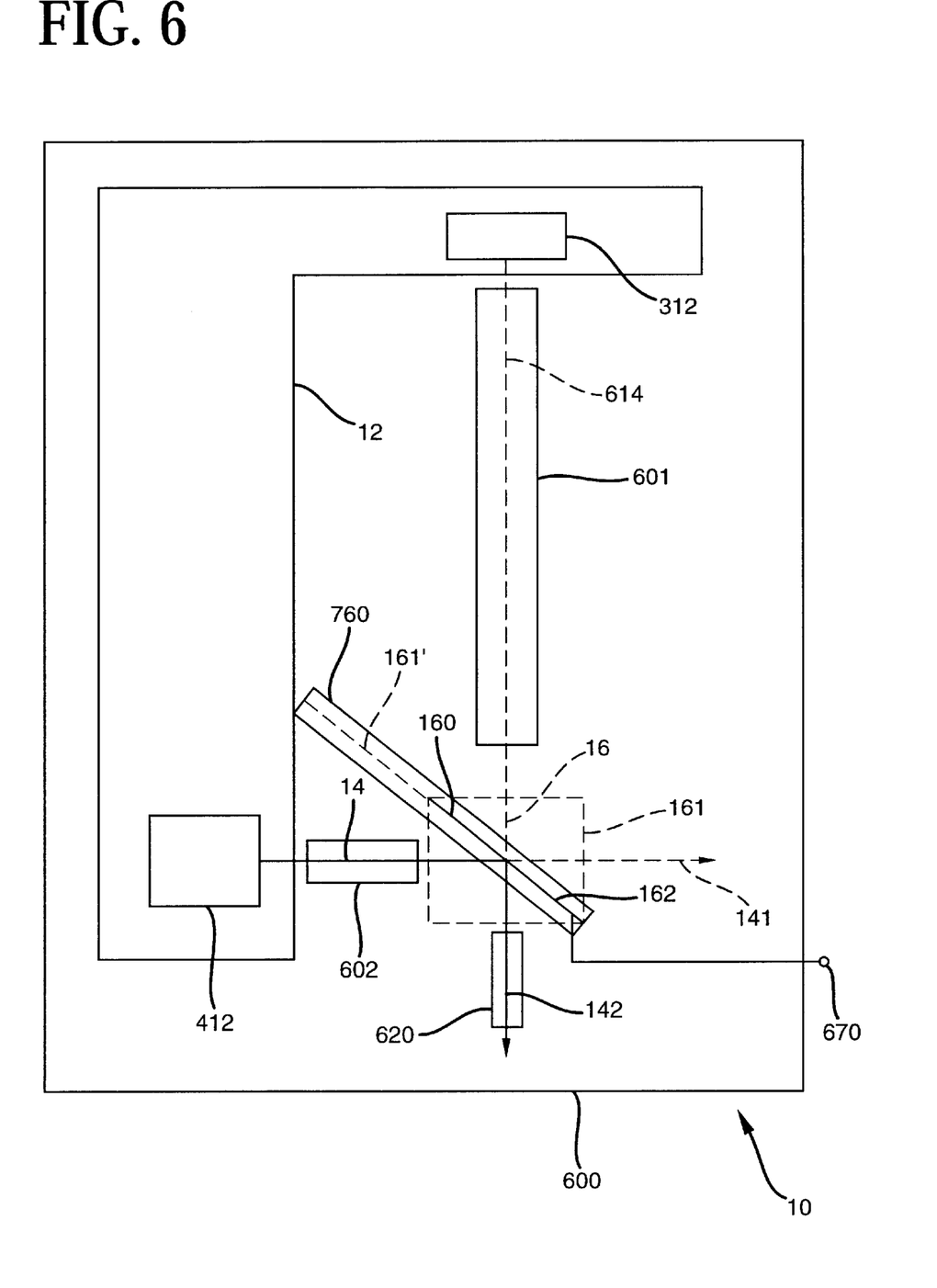
FIG. 6 is a simplified hybridized top-view representation of FIGS. 3–5, in accordance with the present invention.

Referring to FIG. 6, a simplified top-view hybridized version of the MEMS-based selectable laser source 10 of FIG. 1, schematically represented as FIGS. 3–5, is shown generically disposed on a substrate 600. The substrate 600 is preferably made from a light optical circuit planar silicon motherboard. The substrate 600 has a first optical input waveguide 601, a second optical input waveguide 602, and an optical output waveguide 620 that is preferably linearly aligned with the first input waveguide 601 and perpendicularly aligned with the second input waveguide 620. Hence, the first laser source 312 is disposed on the substrate 600 coupled to the first optical input waveguide 601 for providing the normally functioning optical signals 614. The second laser source 412 is disposed on the substrate 600 coupled to the second optical input waveguide 602 for providing the spare optical signal 14, in case a substitute spare is needed as activated by the control signal 670. The MEMS switch 16 has the mirror 160 movable, within a trench 760 in the substrate 600, in response to the control signal 670 to optically direct an optical signal 614 or 14 from either the first optical input waveguide 601 in the first mirror position 161 or the second optical input waveguide 602 in a second mirror position 162 to the optical output waveguide 620 as the laser source output 142. In its upright diagonal alignment of the second position 162, at the intersection of the input and output waveguides, the mirror 160 reflects the optical path 14 from the spare source 412 perpendicularly or otherwise non-linearly away from the non-obstructed exit path 141 such that the spare wavelength of the second source 412 can substitute in for the non-functioning wavelength in the normal first source 312. Because the MEMS switch 16 will be activated only if the applicable laser from the normally functioning source 312 is defective, the exit path 141 will realistically not be taken but shown here only as a reference back to FIG. 1. As stated referring to FIG. 1, the first non-obstructed or open position can be implemented by an upright mirror being slid within the trench 760 in a non-flat position 161', away from the cross-point intersection of input and output waveguides.

Figure 7:
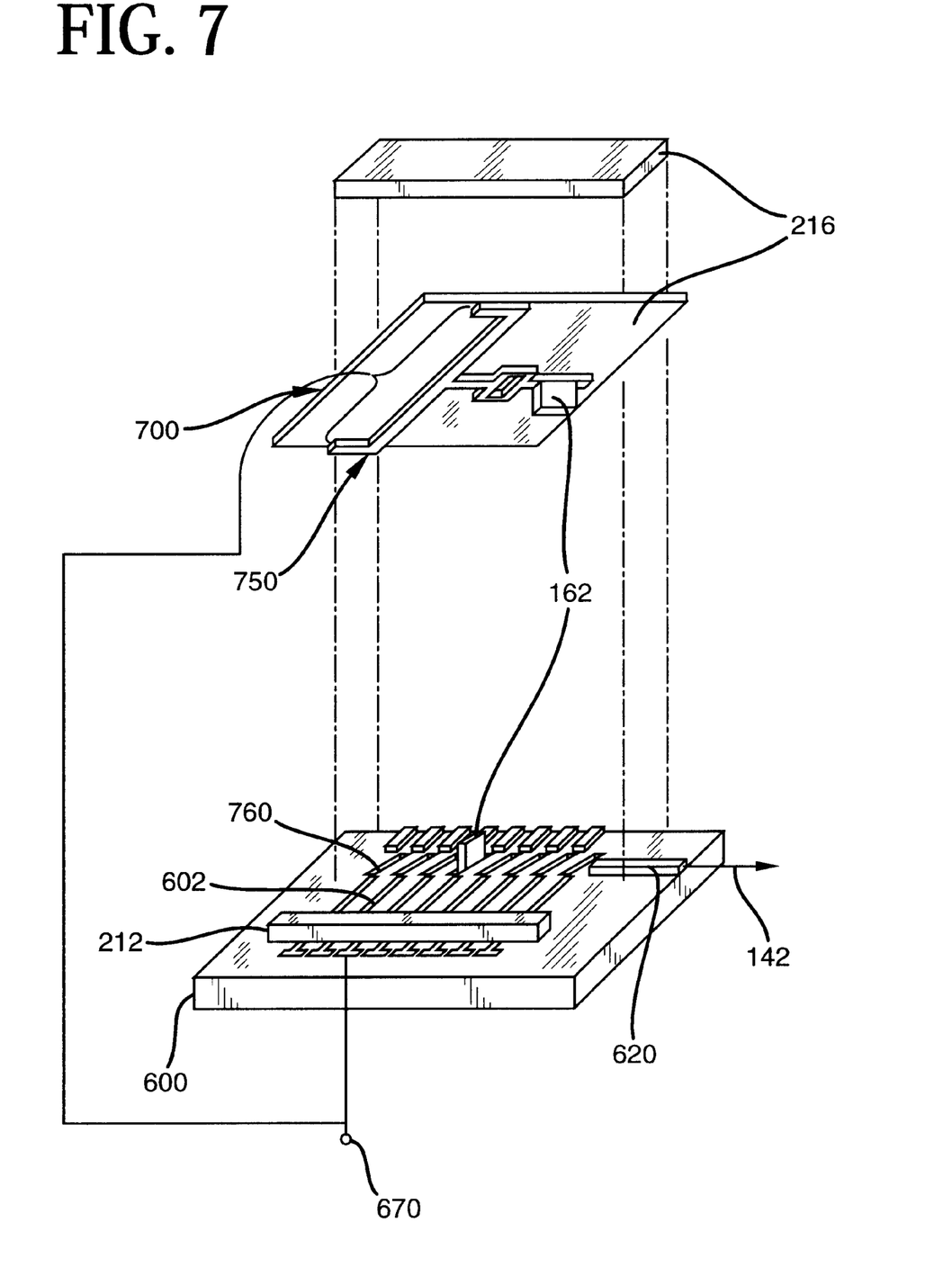
FIG. 7 is a simplified hybridized embodiment of FIG. 2, in accordance with the present invention.

Referring to FIG. 7, a simplified view of the hybridized assembly of the spare source 412 of FIG. 6 and FIG. 2 is represented. The MEMS switch 216 is flip-chipped on the substrate 600 containing the optical waveguides (8 inputs and 1 output) and the trenches 760 at their intersection. The underside of the MEMS switch 216, represented in an enlarged approximation 700, is flip-chipped assembled on top of the substrate 600 where an internal trench 760 of the MEMS switch would be placed at an optical intersection of the second input waveguide 602 and the output waveguide 620. The MEMS switch 216 includes an actuator 750 made from a silicon beam, responding to electrostatic or thermo changes, for sliding the mirror in the up-right position 162 within the trench 760 to selectively reflect the optical signal on the second optical input waveguide 602 to the optical output waveguide 620. Trenches are made in the silica waveguide where the mirror 160 will slide. The trenches 760 are filled with oil having the same optical index as the silica waveguides 602 and 620. The MEMS mirror is slid into the intersection so that the light is reflected to the output, through the trench, instead of just passing through unobstructed when the mirror is laid flat. Hence, the MEMS switch 216 allow the input to output waveguides to connect.

Actual connection of the MEMS switch 216 to the selected laser that is on another chip for the spare array 212 is not needed. When one of the eight lasers, for example, is selected for use, the power is applied to the selected laser by the control signal 670. The separate laser chip or array 212 is set facing the eight input waveguides 602 made of silica. When one of these lasers or array 212 is initialized, the light going through the small input waveguide 602 is obstructed by the cross-connect MEMS switch in the form of the small mirror in its upright position 162, moved by electrostatic or thermal movement for proper reflection in the desired output direction.

Figure 8:
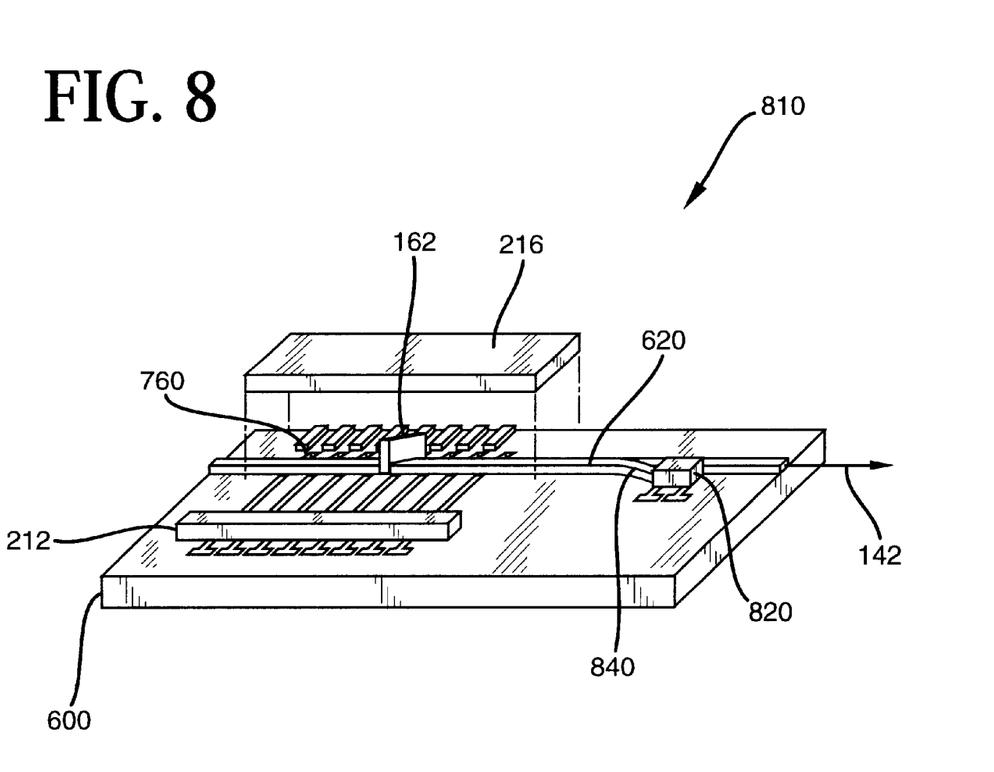
FIG. 8 is a simplified hybridized embodiment of FIG. 2, with the optional addition of a photodetector 820, in accordance with the present invention.

In accordance with the invention, the present invention for the MEMS-based selectable laser source 10 of FIG. 1 and FIG. 7 may further include a photodetector 820 in FIG. 8 for verifying that the laser output 142 has sufficient power. A tap coupler 840 is optically coupled to the MEMS switch 216 for diverting a portion of the laser output from the output waveguide 620 for the photodetector 820 to sense the power within.

Figure 9:
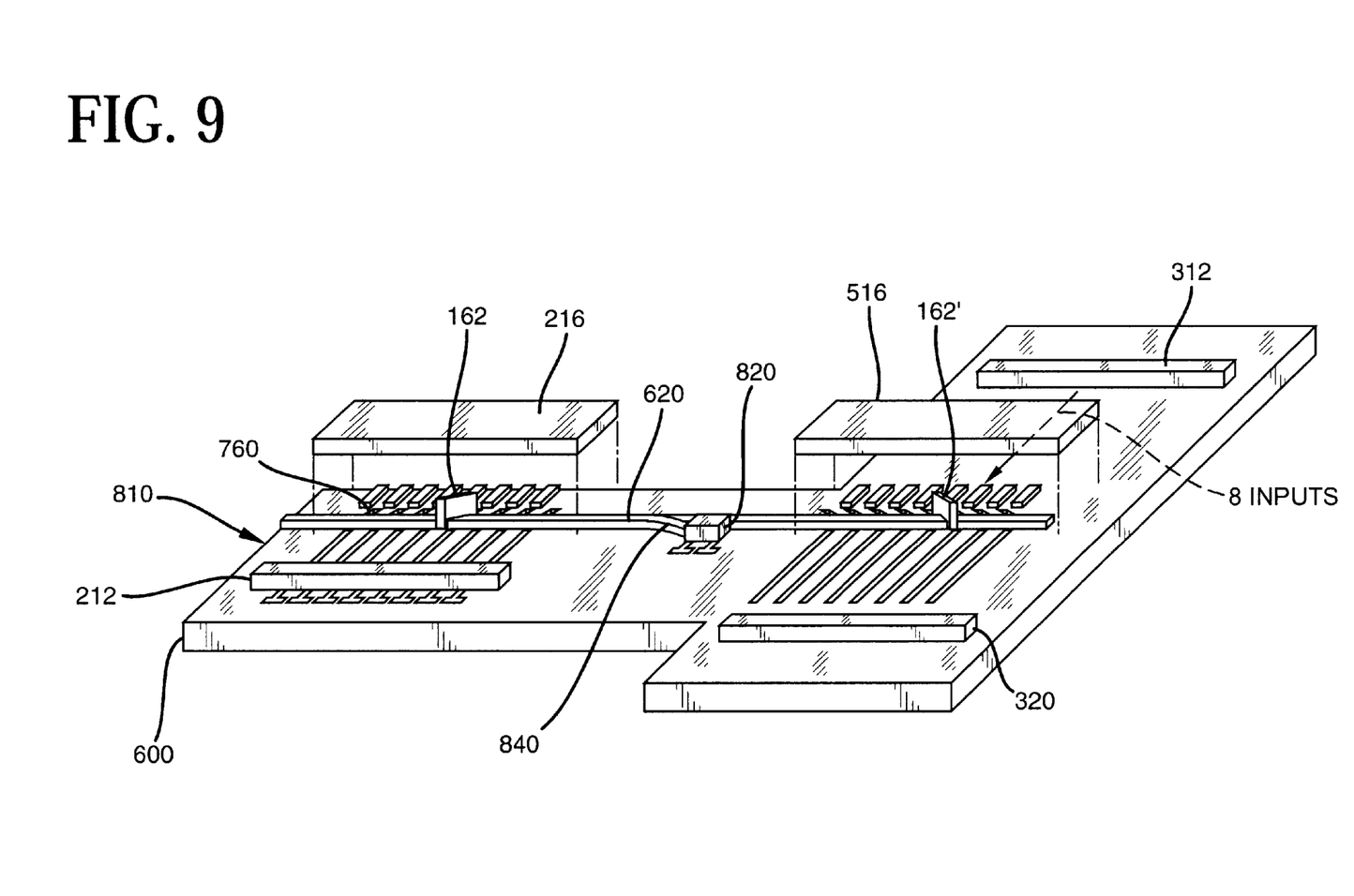
FIG. 9 is a simplified hybridized embodiment of FIG. 5, with the optional addition of the photodetector 820 of FIG. 8, in accordance with the present invention.
Figure 10:
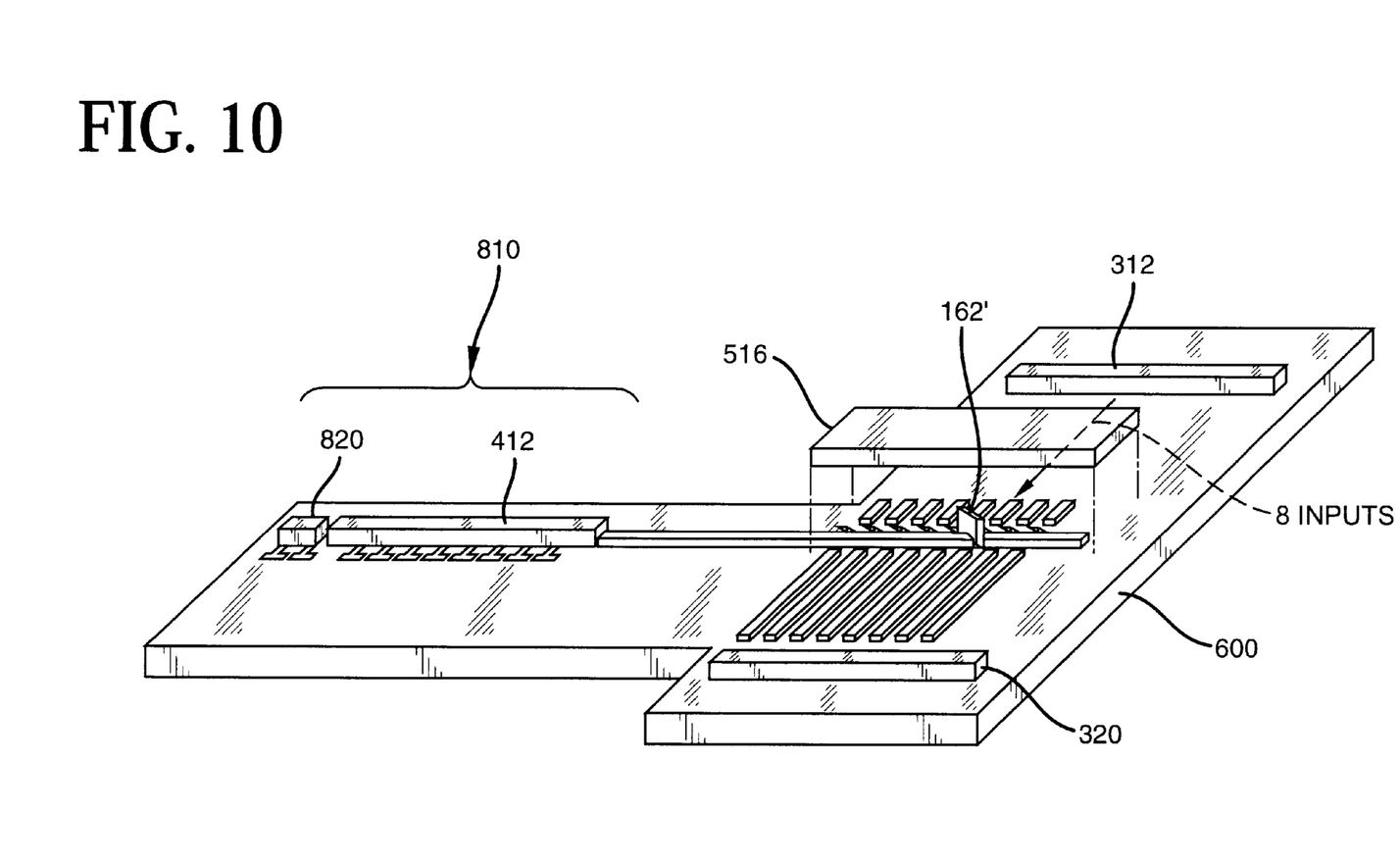
FIG. 10 is a simplified hybridized embodiment of FIG. 4, using a tunable laser as the spare 412 in FIG. 4, in accordance with the present invention.

With the optional addition of the photodetector 820, a hybridized version of FIG. 5 is shown in FIG. 9, in accordance with the teachings of the present invention. Similarly, a hybridized version of FIG. 4 where the tunable laser is used as the spare source 412 is shown in FIG. 10.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A MEMS-based selectable laser output optical device, comprising:
   a primary multi-wavelength laser array having a plurality of n lasers each having a wavelength for providing n different laser outputs in an n numbered sequence;
   a spare multi-wavelength source having n multi-wavelengths tunable at a single laser output;
   a photodetector for sensing when any one of the n laser outputs has insufficient power at a non-functioning wavelength;
   a control signal for activating a corresponding one of the n tunable multi-wavelengths of the spare multi-wavelength source to substitute for the non-functioning wavelength at the single laser output; and
   an n×1 MEMS switch optically coupled to the n different laser outputs of the primary multi-wavelength laser array and the single output of the spare multi-wavelength source for selectively coupling the corresponding one of the n tunable multi-wavelengths of the spare multi-wavelength source instead of the laser output from the non-functioning wavelength of the primary multi-wavelength laser array in a selectable direction to provide the same n numbered sequence of the n different laser outputs, in response to the control signal.

2. The device of claim 1 wherein the primary multi-wavelength laser array having the plurality of n lasers each having a different wavelength.

3. The device of claim 1 wherein the spare multi-wavelength source comprises a tunable laser.

4. The device of claim 1 wherein the spare multi-wavelength source comprises a selectable multi-wavelength laser source.

5. The device of claim 1 wherein the primary multi-wavelength laser array comprises a mono-wavelength laser array having the plurality of n lasers each having the same wavelength.

6. The device of claim 1 further comprising:
   a waveguide for multiplexing and coupling the n different laser outputs into a multiplexed laser output;
   and a tap coupler optically coupled to the waveguide for diverting a portion of the multiplexed laser output for the photodetector to sense power.

7. A MEMS-based selectable laser source comprising:
   a substrate having a first optical input waveguide, a second optical input waveguide, and an optical output waveguide;
   a first laser source having a plurality of n lasers each having a different wavelength for providing n different laser outputs disposed on the substrate coupled to the first optical input waveguide;
   a second laser source having n multi-wavelengths tunable at a single laser output disposed on the substrate coupled to the second optical input waveguide;
   a MEMS switch having a mirror movable in response to a control signal to optically direct an optical signal from one of the first optical input waveguide in a first mirror position or the second optical input waveguide in a second mirror position to the optical output waveguide as the laser source output; and
   a photodetector for sensing when any one of the n different laser outputs of the first laser source has insufficient power at a non-functioning wavelength for providing the control signal to activate a corresponding one of the n multi-wavelengths of the second laser source to substitute for the non-functioning wavelength at the single laser output.

8. The laser source of claim 7 wherein the MEMS switch comprises an actuator for sliding the mirror in a trench to selectively reflect the optical signal on the second optical input waveguide to the optical output waveguide.

9. The laser source of claim 7 wherein the MEMS switch comprises an 1×N array of actuators for selectively sliding the mirror in a trench to selectively reflect the optical signal on the second optical input waveguide to the optical waveguide.

10. The laser source of claim 7 wherein the substrate comprises a light optical circuit planar silicon motherboard having the optical output waveguide disposed linearly in a linear path from the first optical input waveguide and the optical output waveguide is non-linearly disposed away from the second optical input waveguide.

11. The laser source of claim 7 wherein the MEMS switch having the mirror that is slidable from the first position non-obstructing an optical path between the first optical input waveguide and the optical output waveguide and a second position obstructing the optical path between the first optical input waveguide and the optical output waveguide to re-direct the optical path between the second optical input waveguide and the optical output waveguide.

12. The laser source of claim 7 wherein the substrate comprises a light optical circuit planar silicon motherboard having the second optical input waveguide disposed perpendicular to the optical output waveguide.

13. The laser source of claim 12 wherein the MEMS switch comprises an actuator for sliding the mirror in an up-right position at a diagonal optical intersection of the second optical input waveguide and the optical output waveguide in a trench to selectively reflect the optical signal on the second optical input waveguide to the optical output waveguide.

14. A MEMS-based selectable laser source comprising:
- a substrate having a plurality of primary optical input waveguides, a single spare optical input waveguide, and an optical output waveguide;
- a primary multi-wavelength laser array disposed on the substrate and the array having a plurality of n lasers each having a different wavelength for providing n different laser outputs correspondingly connected to each of the plurality of the primary optical input waveguides;
- a spare multi-wavelength source having n multi-wavelengths tunable at a single laser output correspondingly connected to the single spare optical input waveguide for providing a selected laser beam activated on one of the [plurality of n multi-wavelengths in response to a control signal;
- an n×1 MEMS cross-connect switch having a plurality of moving mirrors separately activatable in response to the control signal to optically reflect the selected laser beam coupled from the single spare optical input waveguide to the optical waveguide as the laser source output; and
- a photodetector for sensing when any one of the n different laser outputs of the primary multi-wavelength laser array has insufficient power at a non-functioning wavelength for providing the control signal to activate the corresponding one of the n multi-wavelengths of the spare multi-wavelength source as the selected laser beam to substitute for the non-functioning wavelength at the single laser output.

* * * * *